United States Patent [19]

Holland

[11] Patent Number: 4,665,370
[45] Date of Patent: May 12, 1987

[54] METHOD AND APPARATUS FOR MONITORING AND INDICATING THE CONDITION OF A BATTERY AND THE RELATED CIRCUITRY

[76] Inventor: John F. Holland, 2411 Lyman Dr., Lansing, Mich. 48912

[21] Appl. No.: 187,415

[22] Filed: Sep. 15, 1980

[51] Int. Cl.[4] ............................................. G01N 27/46
[52] U.S. Cl. ..................................... 324/429; 324/433; 340/636
[58] Field of Search ................ 340/636; 324/425, 426, 324/429, 433

[56] References Cited

U.S. PATENT DOCUMENTS

| | | | |
|---|---|---|---|
| 4,028,616 | 6/1977 | Stevens | 324/433 |
| 4,080,560 | 3/1978 | Abert | 340/636 |
| 4,237,198 | 12/1980 | Eby et al. | 340/636 |
| 4,316,185 | 2/1982 | Watrous | 340/636 |

OTHER PUBLICATIONS

M. Weinstein, "Guard Your Battery With PM's Charge Checker", Popular Mechanics, vol. 151, No. 5, May 1979, pp. 84, 86, 264.

*Primary Examiner*—Michael J. Tokar
*Attorney, Agent, or Firm*—Robert G. Mentag

[57] ABSTRACT

A method and apparatus for testing the battery and the related circuitry of an internal combustion automobile every time the vehicle is started. The test is automatic and the results are available for visual interpretation at the discretion of the operator. The cranking motor furnishes the load for the battery and an electronic apparatus automatically measures the condition of the battery every time the engine is started. The battery tester compares the unloaded voltage of the battery with the voltage under load. If the difference is larger than a preset value, or if the voltage drops below a fixed level, an indicator on the dashboard of the vehicle shows that the battery is low in charge, or it is in a faulty condition, or because of faulty conductors its power is not being delivered to the engine.

6 Claims, 2 Drawing Figures

METHOD AND APPARATUS FOR MONITORING AND INDICATING THE CONDITION OF A BATTERY AND THE RELATED CIRCUITRY

BACKGROUND OF THE INVENTION

1. Field of the Invention

This invention relates generally to the testing of storage batteries, and more particularly, to a new and improved method and apparatus for testing the condition of batteries used with internal combustion automobiles wherein the condition of the battery and the related circuitry is measured each time the engine of the automobile is started. The invention is specifically concerned with the novel method and apparatus whereby the cranking motor of the internal combustion engine furnishes the load for the battery, and an electronic apparatus automatically measures the condition of the battery and the related circuitry each time the engine is started.

2. Description of the Prior Art

Throughout the many prior years of the use of electrical starting of internal combustion automobiles, the condition of the automobile storage battery has been of a major concern to the motorist. Heretofore, several methods have been used to determine the charge and condition of such a battery when under a large current load. This prior art method is usually accomplished by a device that is attached to the positive and negative terminals of the battery, in or out of the automobile. Said device furnishes a low resistance path between these terminals and contains a simple voltmeter circuit with a meter face that is calibrated in regions of bad, questionable, and good, by means of a printed decal.

The prior art testing methods have consistently utilized concepts of off-line analysis for automotive battery testing applications. The battery is tested in the car or removed from it. In either case, an external load is applied and the voltage measurements are made on a calibrated meter face, by light displays, or other means. The test is usually performed as part of a diagnostic procedure initiated because of failure of some part of the engine or electrical system components.

Other examples of prior art battery testers which compare loaded to non-loaded voltage levels are disclosed in U.S. Pat. Nos. 3,356,936; 3,899,732; 4,027,231; 4,028,616; 4,044,304; 4,080,560; 4,180,770 and 4,193,025.

SUMMARY OF THE INVENTION

In accordance with the present invention, the storage battery of an internal combustion engine is repeatedly tested every time the vehicle is started. The test is automatic and the results are available for visual interpretation at the discretion of the operator. The method of the present invention involves a a continued testing of the battery and will reveal problems prior to occurrences of total failures of a battery to crank an engine. The method and apparatus of the present invention provides an early warning system for an automotive battery which under usual conditions will enable an operator to take preventive and curative measures prior to complete failure of a battery and thus obviate unnecessary failures.

The present invention provides a new approach to the concept of battery testing and voltage measurement under load whereby the prior art artificial load circuits employed heretofore are replaced by the actual load of the unit being tested in its own unique environment. The method and apparatus of the present invention provides a more realistic approach to the testing of automotive batteries since it evaluates the ability of a battery to crank an internal combustion engine by measuring the ease with which it can precisely do that job.

An advantage of the method and apparatus for testing storage batteries of an internal combustion engine is that the test is automatic and it happens every time the engine is started and the complete system of an engine is tested as an integrated iunctioning unit. The method and apparatus of the present iunvention does not introduce any artificial test condition for an automotive battery, but rather evaluates the performance of the entire starting electrical system under normal operating conditions. The apparatus of the present invention can be used on any internal combustion engine in a stationary or moving system that utilizes chemical battery powered starting. The present invention greatly reduces warranty replacements since the test carried out by the apparatus of the present invention may lead to diagnostic procedures in which the faulty component, or condition may be easily identified. That is, a bad voltage regulator or generator can be detected while the battery is still good.

The method and apparatus of the present invention employs the cranking motor of an automotive engine for furnishing the load for the battery and an electronic apparatus automatically measures the condition of the battery each time the engine is started. The apparatus of the present invention includes a circuit that captures the non-loaded voltage of the battery and compares it with the voltage under load. A comparison can be made between the realtime differential, or a comparision with a fixed voltage. If the difference is larger than a preset value or if the voltage drops below a fixed level, an indicator on the dashboard of the vehicle shows that the battery is low in charge or in a faulty condition. If the indicator continues to show trouble for successive starts, the motorist is warned to seek service well in advance of total failure. Under normal conditions, the apparatus of the present invention will avoid battery caused starting failures which create troublesome and possibly dangerous situations. The apparatus of the present invention can be packaged for assembly line installation in new model vehicles, and it also may be packaged as an after-market apparatus for most existing automobiles.

DESCRIPTION OF THE PREFERRED EMBODIMENTS

Figure 1:
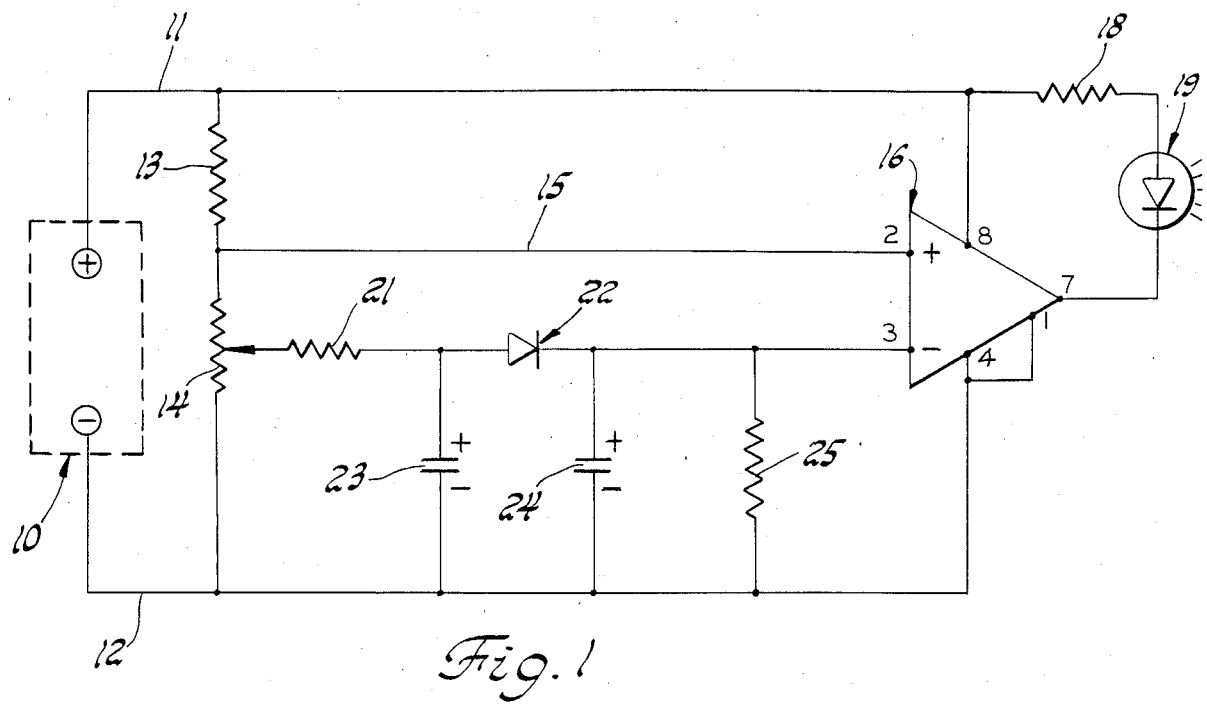
FIG. 1 is a circuit diagram of a first embodiment of the invention.

Referring now to the drawings, and in particular to FIG. 1, the numeral 10 generally designates the storage battery of an automotive vehicle which is to be tested by the method and apparatus of the present invention every time the engine of the vehicle is started. The numeral 11 designates a lead which is attached to a terminal on the electrical system of the vehicle which is directly attached to the positive battery terminal. A lead 12 is attached to a point that is electrically connected to the battery negative terminal. In most cases, the last mentioned point will be the chassis of the vehicle system. The power for operating the test apparatus illustrated in FIG. 1, is thus obtained from the battery 10.

Whenever the engine of the vehicle is not being used, there is little or no load on the battery 10. That is, the clock, safety lights and other electrical apparatuse which ordinarily do not create a large load on the battery 10. Under the last mentioned conditions, the capacitors 23 and 24 are charged to the network comprising the resistors 13, 14, 21 and 25, and the diode 22 to a fixed fraction of the non-loaded battery voltage.

The numeral 16 generally designates a conventional comparator. The input pin 2 of the comparator 16 is connected by the lead 15 to a junction point between the resistors 13 and 14. The voltage on input pin 2 of the comparator 16 will lie positive of the voltage on input pin 3 of comparator 16.

The input pin 2 of the comparator 16 is connected by the lead 15 to a junction point between the resistors 13 and 14. The resistors 13 and 14 are connected in series with each other and across the leads 11 and 12. The leads 11 and 12 are connected to the input pins 8 and 4, respectively, of the comparator 16. One end of the resistor 21 is connected by a wiper to the adjustable resistor 14, and the other end is connected to the anode of the diode 22. The cathode of the diode is connected to the input pin 3 of the comparator 16. The capacitor 23 is connected between the lead line 12 and the terminal between the resistor 21 and the diode 22. The capacitor 24 is connected in parallel with the resistor 25, between the lead 12 and the lead between the cathode of the diode 22 and the input pin 3 of the capacitor 16. The lead wire 11 is connected to pin 8 of the comparator 16 and to one end of a resistor 18, with the other end of the resistor 18 being connected to the positive side of a light emitting diode (LED), generally indicated by the numeral 19. The negative side of the light emitting diode 19 is connected to the output pin 7 of the comparator 16.

The input pin 2 of the comparator 16 is the non-inverting input of the comparator 16, and the output pin 7 would likewise be positive when the engine is not being used so as to keep the light emitting diode (LED) 19 in the "off" position.

In use, when the engine of an automotive vehicle carrying a battery is cranked, the voltage of the battery 10 may lower to an extent dependent upon the capacity of the battery 10 and the load being driven. With a good battery, which is well charged, and under a normal load, this voltage drop will be small. If the condition of the battery 10 or its high current components is faulty, or the load abnormally large, then the voltage at lead 11 will drop significantly when the engine starter is engaged. The charge on capacitor 24 will be protected from this drop by the action of diode 22. The function of resistor 25 is to remove the effects of an input current bias of comparator 16. The time constant of the circuit 24 and resistor 25 is on the order of minutes and will not adversely effect the measurements. At the point when the instantaneous voltage on the input 2 of the comparator 16 becomes less than the captured voltage in input pin 3, the output the comparator 16 will approach zero volts. At this time, the comparator 16 will sink current through resistor 18 and the LED 19 to create a visual indication of the voltage relationships. The relative magnitude of the voltage drop under load that will enable the LED 19, is set by the variable resistor 14. If the LED 19 turns on, the battery 10 is working very hard during that cranking operation. If this observation continues to occur for successive starts, the operator is alerted to have the electrical system inspected in order to locate the reason for activation of this alarm. In most situations, this action can be taken in advance of complete malfunction. The function of resistor 21 and capacitor 23 is to act as a filter to eliminate short term transients from affecting the captured voltage on capacitor 24.

Figure 2:
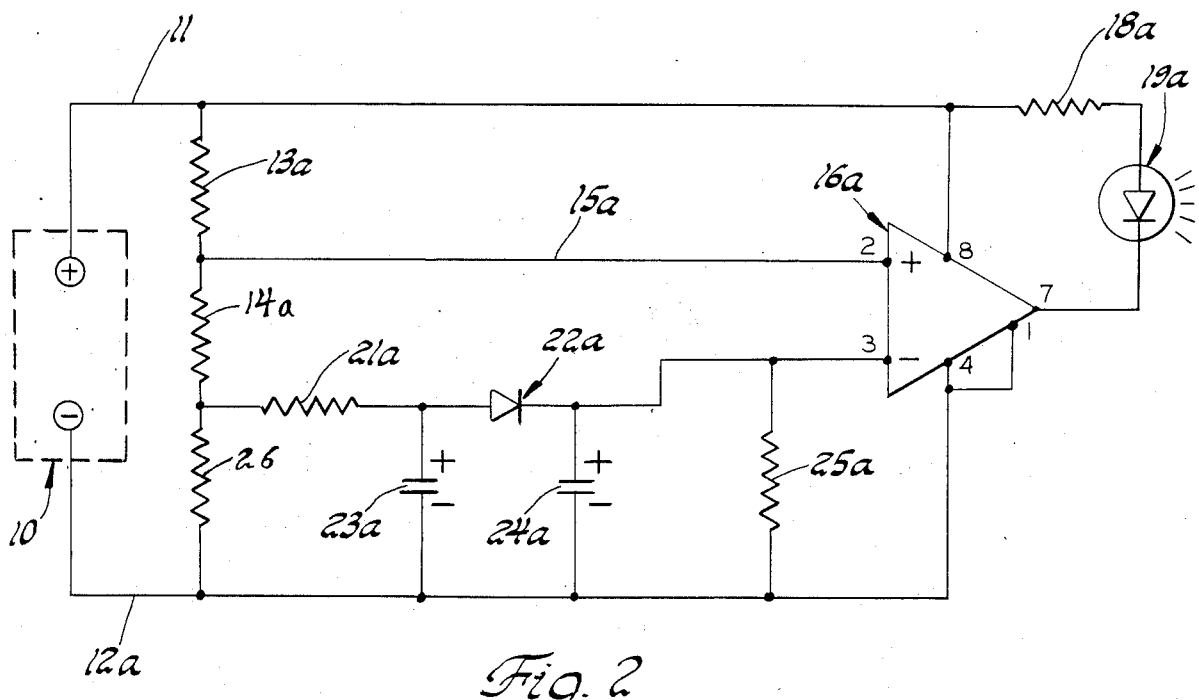
FIG. 2 is a circuit diagram of a second embodiment of the invention.

FIG. 2 illustrates a second circuit for carrying out the invention which is the same as the first circuit with the exception that a voltage divider is employed which comprises the resistors 13a, 14a, and 26. The voltage divider employed in the circuit of FIG. 2 provides an invariant or constant voltage ratio related to the ratios of resistors 14a and 26, as follows:

$$\frac{R_{26}}{R_{14a} + R_{26}}$$

The following is a listing of suitable elements for the circuits of FIGS. 1 and 2.

| | |
|---|---|
| Capacitor 23, 23a | 47 uf |
| Capacitor 24, 24a | 10 uf |
| Diode 22, 22a | 1N914 |
| Diode 19, 19a | Jumbo LED |
| Comparator 16, 16a | LM 311 comparator |
| Resistor 13, 13a | 10K ohms |
| Resistor 14 | 10K ohms |
| Resistor 21, 21a | 1 M ohms |
| Resistor 25, 25a | 75 M ohms |
| Resistor 18, 18a | 470 ohms |
| Resistor 14a | 2K ohms |
| Resistor 26 | 8K ohms |

It will be understood that other suitable types of light indicators, or other types of indicators, may be employed in lieu of the LED 19. It wil also be understood that the method of the present invention evaluates the performance or condition of the battery of an internal combustion engine as well as the entire electrical starting system including, cables, solenoids, relays and so forth.

What is claimed is:

1. A method for automatically monitoring and indicating the condition of a storage battery for an internal combustion engine in a vehicle when the engine is started, comprising the steps of:
   (a) automatically detecting the non-loaded voltage of the battery prior to starting the engine;
   (b) automatically detecting the voltage of the battery under load when the cranking motor of the internal combustion engine is operated during engine start-up;
   (c) automatically comparing the non-loaded voltage of the battery to the voltage under engine cranking load during enging start-up; and,
   (d) automatically indicating the relationship of said voltages by an indicator means to provide a visual indication of the condition of the battery every time the cranking motor of the internal combustion engine is operated to start the engine.

2. A method for automatically monitoring and indicating the condition of a storage battery for an internal combustion engine in a vehicle when the engine is started, as defined in claim 1 wherein:
   (a) the non-loaded voltage is maintained as a fixed voltage during engine start-up.

3. In an apparatus permanently mounted on a vehicle for automatically monitoring and indicating the condition of a storage battery for an internal combustion engine in a vehicle when the engine is started, the combination comprising:
   (a) an automatic comparison means permanently mounted on said vehicle;
   (b) circuit means permanently mounted on said vehicle and connected between the vehicle battery and the comparison means, and which includes a first input means for detecting the non-loaded battery voltage;
   (c) circuit means permanently mounted on said vehicle and connected between said vehicle battery and the comparison means, and which includes a second input means for detecting the voltage of the vehicle battery under load when the cranking motor of the internal combustion engine is operated each time the engine is started; and,
   (d) indicator means permanently mounted on said vehicle and connected to said comparison means to automatically indicate the relationship of said voltages to provide a visual indication of the condition of the vehicle battery every time the cranking motor of the internal combustion engine is operated to start the engine.

4. An apparatus permanently mounted on a vehicle for automatically monitoring and indicating the condition of a storage battery for an internal combustion engine in a vehicle when the engine is started, as defined in claim 3, wherein:
   (a) said circuit means connected between the vehicle battery and said comparison means includes first input means for detecting a fraction of the non-loaded battery voltage.

5. An apparatus permanently mounted on a vehicle for automatically monitoring and indicating the condition of a storage battery for an internal combustion engine in a vehicle when the engine is started, as defined in claim 3, wherein:
   (a) said circuit means connected between the vehicle battery and said comparison means for detecting the non-loaded battery voltage includes a voltage divider means.

* * * * *